Jan. 27, 1970 R. V. GOORDMAN 3,492,504

TRANSISTOR SWITCHING CIRCUIT

Filed Nov. 22, 1965

INVENTOR
R. V. GOORDMAN
BY Roy M. Porter Jr.
ATTORNEY

United States Patent Office 3,492,504
Patented Jan. 27, 1970

3,492,504
TRANSISTOR SWITCHING CIRCUIT

Robert V. Goordman, Hackettstown, N.J., assignor to Bell Telephone Laboratories, Incorporated, New York, N.Y., a corporation of New York Filed Nov. 22, 1965, Ser. No. 509,075
Int. Cl. H03k 17/12
U.S. Cl. 307—254 5 Claims

ABSTRACT OF THE DISCLOSURE

The present invention involves a gate circuit capable of transmitting relatively large signal currents with high efficiency from source to load and controllable by relatively small control currents. The invention departs from the prior art by providing separate control and bias sources, and using the transistors in their active regions rather than in saturation.

This invention relates to electronic switching devices or gates and more particularly to gates which are capable of controlling relatively large signal currents by means of relatively small control currents.

Typical prior art switching circuits include the Lewis-Meacham gate, originally disclosed in Patent 2,535,303 to W. D. Lewis, dated Dec. 26, 1950, and Patent 2,576,026 to L. A. Meacham, dated Nov. 20. 1951, and variations thereof. In general these gates or switches include a network of asymmetrically conducting devices or diodes arranged in a path that controls the flow of energy from the signal source to a load. When one or more of these diodes are back-biased in their high impedance direction, either by the signal currents or by a suitably applied-bias, the source is isolated from the load. When the control energy overrides the signal currents and forward-biases the diodes in their low impedance direction, the signal is applied to the load.

It is a recognized characteristic of circuit of this type that in order to avoid clipping or limiting of the signal, its voltage (or current) must be considerably less than the amplitude of the control energy voltage (or current) otherwise the control signal may fail to override the signal current, producing an undesired reverse bias of one or more of the diodes. This limitation presents no problem in the usual digital application where the control signal can be as strong as necessary. In connection with contemporary interest in optical systems, however, it becomes necessary to gate a strong electrical signal by a weak optical beam. Since all types of presently known optical detectors are low current and voltage devices, previously useful electronic gates are now unsatisfactory.

It is, therefore, an object of the present invention to improve electronic switching devices. More specifically, it is an object of the present invention to increase the signal current which can be handled with a given gating current or conversely to decrease the gating current required to handle a given signal current.

In accordance with a particular embodiment of the invention these objects are accomplished by employing a pair of transistors arranged with their respective bases directly connected together, their respective collectors commonly connected to the power source and their respective emitter circuits comprising the input and output signal circuits of the gate. The control current is applied in parallel to both bases in a way which utilizes the gain of the transistors to reduce the amount of control current required to handle a given signal current. In a further embodiment, the principles of the invention are extended to a balanced bridge configuration.

A further feature of the invention resides in the fact that the signal energy is transferred through the gate with a minimum loss, whereas in the diode gates of the prior art, the forward-biased impedance of the diodes contributed to a substantial signal loss even under optimum operating conditions.

These and other objects and features, the nature of the present invention and its various advantages, will appear more fully upon consideration of the specific illustrative embodiments shown in the accompanying drawings and described in detail in the following explanation of these drawings, in which.

Figure 1:
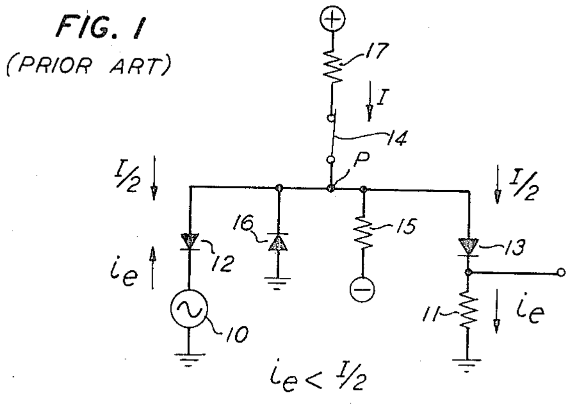
FIG. 1 (PRIOR ART)
FIG. 1 shows schematically a prior art electronic switch of the above-mentioned Lewis-Meacham type.

Referring to FIG. 1, a typical prior art gating circuit is shown in order to afford a basis of comparison with the present invention. The path for signal current $i_e$ from source 10 to load 11 includes two diodes 12 and 13 having like electrodes connected together at common point P. As particularly illustrated, diodes 12 and 13 are arranged so that their low impedance directions accommodate a positive current flow away from point P. It is generally preferred in practice that both diodes be initially back-biased by maintaining point P at a small negative potential, typically by means of a supply voltage negative with respect to ground applied to point P through a large impedance 15 to produce a forward-bias voltage drop across a diode 16 connected between point P and ground. In the absence of switching current I, represented schematically by switch 14 in an open position, back-biased diodes 12 and 13 prevent the flow of signal current through load 11.

When a control signal positive with respect to ground is applied by closing switch 14, the switching current I flows through impedance 17 representing the switch source impedance, diode 16 is back-biased, point P is positive, and the switching current divides to flow in the forward low impedance direction through both diodes 12 and 13. Thus, the T-pad between source 10 and load 11 has a low series resistance, a high shunt resistance and the attenuation between source 10 and load 11 is small.

Note, however, that the signal current $i_e$ cannot exceed $I/2$ during the positive voltage swing of source 10 without back-biasing diode 12 or during the negative voltage swing without back-biasing diode 13. If either diode is back-biased, the signal transmission from source 10 to source 11 will be interrupted. Operation of the circuit is restricted to the condition $i_e < I/2$, and if impedance 17 is very large and current I is very small, this may be unsatisfactory in many applications. Further note that the voltage developed across load 11 is in all cases reduced from that of source 10 by the drop across the impedances of diodes 12 and 13.

Figure 2:
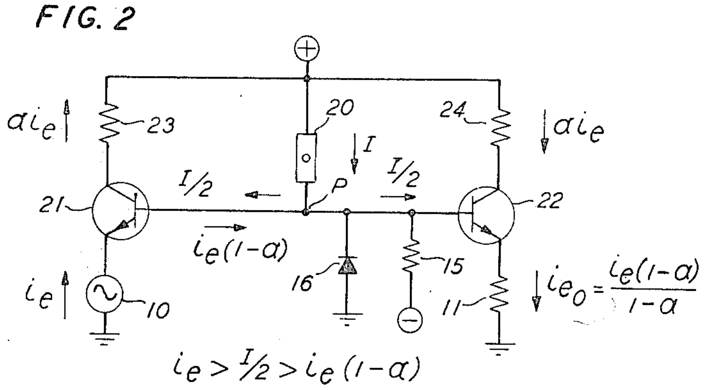
FIG. 2 shows schematically a transistor switch in accordance with the present invention.

Both of these restrictions are avoided in accordance with the invention by the circuit shown in FIG. 2 in which corresponding reference numerals have been used to designate corresponding components. The source 20 of control current is now represented as a photosensitive device such as a photodiode, phototransistor, or other photoelectric converter characterized by a high internal impedance and a low current capacity. It will be assumed that when device 20 is activated by a light beam its internal impedance is decreased.

A pair of transistors 21 and 22 shown by way of illustration as being of the NPN type and having the usual base, collector and emitter electrodes designated by conventional symbols, are arranged with their respective bases connected at point P. Source 10 is connected between the emitter and ground of transistor 21 and load 11 is connected between the emitter and ground of transistor 22. The respective collectors are connected substantially directly to a voltage source positive with respect to ground since impedances 23 and 24, included only to limit thermal runaway, are small and may be omitted in a specific design. It is interesting to note that insofar as signal currents are concerned in the configuration thus described, transistor 22 appears as a conventional emitter-follower but that transistor 21 appears in a unique configuration in which the input signal is applied to the emitter and the output is taken from the base. It should be understood that PNP transistors can be used in the circuit of FIG. 2 merely by reversing the polarities of the bias sources and reversing the polarity of diode 16.

Operation of the invention in accordance with FIG. 2 can best be understood by first recognizing that each transistor performs three separate functions, namely: a gating function in which the base-emitter junction of each transistor replaces the diodes of FIG. 1; a signal amplification function by means of which a net unity gain through both transistors can deliver the output signal at substantially the voltage impressed upon the input thereby overcoming the losses inherent in the diodes of FIG. 1; and most important, a leverage function which enables the small base current supplied by the control source to handle the large emitter current required to override a large signal current.

More specifically, in the absence of control current I, point P is slightly negative due to the action of diode 16 as described in FIG. 1. Both transistors are cut off, placing the two very high base-emitter impedances in series with the signal path.

When device 20 is actuated by light, the current $I/2$ flows into the same base of each transistor 21 and 22 and in parallel through the respective base-emitter paths. Defining the ratio of collector current to emitter current in each transistor as $\alpha$, the emitter current in each is $$I_E=\frac{I}{2(1-\alpha)} \qquad (1)$$

and the emitter-base impedance drops to a very low value. A typical value of $\alpha$ is at least 0.9 making the factor $(1-\alpha)$ equal to 0.1 or less so that the emitter current $I_E$ defined by Equation 1 can easily be large compared to and therefore override the signal current $i_e$. Similarly, in the base circuit of each transistor the signal current is reduced to $i_e\ (1-\alpha)$ which is small compared to and can therefore be overridden by a base switching current $I/2$. Thus, it is possible for the switching currents $I/2$ to be merely one-tenth of the signal current $i_e$ or conversely for the signal current to be ten times that which could be handled by a given switching current in FIG. 1. According to one method of analysis the balance of the signal current may be considered as having been bypassed around the base-switching circuits into the collector circuits which respectively absorb and supply currents equal to $\alpha i_e$.

The output signal current is $$i_{eo}=\frac{i_e(1-\alpha)}{(1-\alpha)}=i_e \qquad (2)$$

and the output voltage may be expressed $$V_1=\frac{V_eZ_1}{Z_1+Z_e+2(1-\alpha)r_b+\dfrac{2KT}{qI_E}}$$

where $V_e$ is the input voltage, $Z_L$ and $Z_e$ are the output and input impedances respectively, $r_b$ is the base resistance, K is Boltzman's constant, T is junction temperature in degrees Kelvin and $q$ is the election charge in coulombs. Thus a substantial increase in power transmission efficiency is obtained over the arrangement of FIG. 1.

Figure 3:
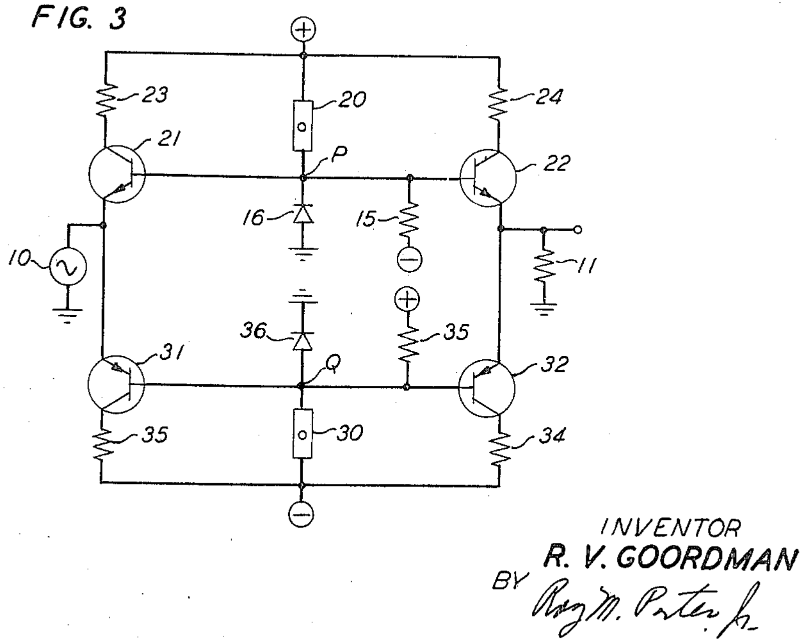
FIG. 3 shows schematically a balanced version of a transistor switch in accordance with the invention.

Typical of unbalanced circuits of this type, the circuit of FIG. 2 delivers the gated portion of the signal superimposed upon a pedestal. In those applications where the pedestal constitutes a disadvantage, the balanced circuit of FIG. 3 may be employed. The top half of FIG. 3 is identical to FIG. 2 and corresponding reference numerals have been employed to designate corresponding components. Balance with the upper half of the circuit is provided by a second pair of transistors 31 and 32 which are of the opposite conductivity type to transistors 21 and 22 and are connected so that current flows from the positive supply terminal through the collector-emitter path of transistor 21 or transistor 22, through the emitter-collector path of transistor 31 or transistor 32, through the current limiting resistors 33 and 34 to the negative supply terminal. The bases of transistors 31 and 32 are tied together at point Q which is maintained at a small positive potential by means of a positive supply voltage applied to point Q through large resistor 35 to produce a forward bias voltage drop across diode 36 connected between point Q and ground.

According to a preferred application of the circuit of FIG. 3, a second optical device 30 is connected between point Q and the negative supply terminal. Device 30 is preferably identical to device 20 and is physically located adjacent to device 20 so that they are both activated by the same optical beam. Thus, if both devices 20 and 30 are simultaneously and equally activated, two parallel signal paths are provided from the input to the output, each of the type described with reference to FIG. 2 and each having the advantages pointed out hereinbefore. If the components are all matched, no direct current or switching current flows through load 11 and no pedestal is present.

If, however, only one of the optical devices is activated, for example, only device 20, the gate still closes as follows. Transistors 21 and 22 go into conduction as described in connection with FIG. 2. Their emitters and, therefore, the emitters of transistors 31 and 32 are substantially more positive than point Q and the bases of transistors 31 and 32. Parallel base current paths can, therefore, be traced from the positive supply terminal, through device 20, base-emitter paths of transistors 21 and 22, emitter-base paths of transistors 31 and 32 and through forward-biased diode 36. The circuit is slightly unbalanced due to the forward drop across diode 36 and to this extent the output appears on a small pedestal. Thus, while it is preferably contemplated that both devices 20 and 30 be dually energized, failure to energize them equally or complete failure of one will not render the circuit totally inoperative. Further it should be understood that since devices 20 and 30 function in the circuit only as variable impedances they may be replaced by other components including transistors suitably driven by a control signal.

In all cases it is to be understood that the above-described arrangements are merely illustrative of a small number of the many possible applications of the principles of the invention. Numerous and varied other arrangements in accordance with these principles may readily be devised by those skilled in the art without departing from the spirit and scope of the invention.

What is claimed is:

1. A gate circuit capable of controlling a signal current having a given maximum amplitude by means of a control current which is substantially less than said amplitude, said gate comprising a pair of transistor devices each including a base electrode, an emitter circuit and a collector circuit, the base electrodes of said devices being connected together, said control current being applied to said connected bases, means for applying said signal current to the emitter circuit on one of said devices, an output load being coupled to the emitter circuit of the other of said devices, and means for applying direct current biasing potential to said collector circuits.

2. The gate circuit according to claim 1 including means for maintaining said base electrodes at a potential which cuts off both said transistors in the absence of said control current.

3. A gate circuit connecting a signal input to a signal output in response to a control current comprising a first pair of transistor devices each including a base, a base-emitter path and a collector-emitter path, the base-emitter paths of both said transistors being serially included between said signal input and said signal output with said bases connected together, means for connecting a direct current supply across said collector-emitter paths, and means for applying said control current to said bases to flow in parallel through said base-emitter paths, and further comprising a second pair of transistor devices each including a collector-emitter path and being of a conductivity type opposite to that of said first-mentioned pair, the transistors of said second pair having their bases connected together and the collector-emitter paths thereof respectively connected in series with respective collector-emitter paths of the first mentioned pair.

4. A gate circuit for connecting a signal input to a signal output in response to a control current comprising a first pair of transistor devices each including a base, a base-emitter path and a collector-emitter path, the base-emitter paths of both said transistors being serially included between said signal input and said signal output with said bases connected together, means for connecting a direct current supply across said collector-emitter paths, and means for applying said control current to said bases to flow in parallel through said base-emitter paths, and further comprising a second pair of transistor devices each including a base, a base-emitter path and a collector-emitter path and being of a conductivity type opposite to that of said first-mentioned pair, the base-emitter paths of both transistors of said second pair being serially included between said signal input and said signal output with said bases connected together, the collector-emitter paths of said second pair being respectively connected in series with said collector-emitter paths of the first-mentioned pair, and means for applying control current to said bases of said second pair to flow in parallel through said base-emitter paths of said second pair.

5. The gate circuit according to claim 4 including means for maintaining the bases of said first named pair at a potential of a first polarity and the bases of said second pair at an opposite polarity which respectively cuts off said transistors in the absence of said control currents.

References Cited

UNITED STATES PATENTS

| | | | |
|---|---|---|---|
| 3,024,448 | 3/1962 | Wright | 307—254 |
| 2,838,675 | 1958 | Wanlass | 307—255 |
| 2,891,171 | 1959 | Shockley | 307—254 |
| 2,962,603 | 1960 | Bright | 307—254 |
| 2,994,044 | 1961 | Straube | 307—255 |
| 3,010,079 | 1961 | Straube | 307—255 |
| 3,077,545 | 1963 | Rywak | 307—255 |
| 3,253,161 | 5/1966 | Owen | 307—254 |
| 3,304,431 | 1967 | Biard | 307—254 |

JOHN S. HEYMAN, Primary Examiner

H. DIXON, Assistant Examiner